(12) United States Patent
Bollenbeck et al.

(10) Patent No.: US 7,459,946 B2
(45) Date of Patent: Dec. 2, 2008

(54) CIRCUIT ARRANGEMENT FOR GENERATING A REFERENCE SIGNAL

(75) Inventors: Jan Bollenbeck, Eggolsheim (DE); Markus Vester, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 231 days.

(21) Appl. No.: 11/443,558

(22) Filed: May 30, 2006

(65) Prior Publication Data

US 2007/0035350 A1 Feb. 15, 2007

(30) Foreign Application Priority Data

May 30, 2005 (DE) .................. 10 2005 024 624

(51) Int. Cl.
 *H03B 19/00* (2006.01)
(52) U.S. Cl. .................. 327/116; 327/119; 327/156
(58) Field of Classification Search .................. 327/156, 327/116, 119; 331/53
See application file for complete search history.

(56) References Cited

U.S. PATENT DOCUMENTS

| 4,361,894 | A | | 11/1982 | Kurihara et al. |
| 4,551,689 | A | * | 11/1985 | Scala et al. ................ 331/2 |
| 4,831,339 | A | * | 5/1989 | Nemeth ................ 331/25 |
| 5,752,175 | A | * | 5/1998 | Roullet et al. ............ 455/183.1 |
| 6,392,501 | B1 | | 5/2002 | Murtojärvi |
| 6,515,714 | B1 | * | 2/2003 | Tachibana ................ 348/654 |

FOREIGN PATENT DOCUMENTS

| DE | 21 39 039 | 4/1978 |
| DE | 30 29 249 | 11/1984 |

OTHER PUBLICATIONS

"RF Design Guide—Systems, Circuits and Equations," Vizmueller (1995) pp. 230-233.

* cited by examiner

*Primary Examiner*—Lincoln Donovan
*Assistant Examiner*—John W Poos
(74) *Attorney, Agent, or Firm*—Schiff Hardin LLP

(57) ABSTRACT

In a circuit arrangement for generation of a reference signal with an oscillation generator, a phase-controlled filter and a frequency multiplier are arranged downstream from the oscillation generator. The frequency multiplier is connected with an output for emission of the reference signal.

13 Claims, 3 Drawing Sheets

CIRCUIT ARRANGEMENT FOR GENERATING A REFERENCE SIGNAL

BACKGROUND OF THE INVENTION

1. Field of the Invention

The present invention concerns a circuit arrangement of the type that generates a reference signal using an oscillation generator.

2. Description of the Prior Art

In various electronic apparatuses and systems, high-stability and low-noise high-frequency (radio-frequency) signals are required as a reference. The function of the reference signal is dependent on the specific application case. For example, such a reference signal is used as a clock signal for analog-digital converters (ADC) and digital-analog converters (DAC) and as a clock signal for direct digital synthesis (DDS), and as a reference signal for phase control loops (PLL).

The quality (performance) of the signal with regard to stability or lack of noise is generally characterized via parameters such as, for example, the long-term frequency stability (deterioration due to aging), the short-term frequency stability, the frequency and phase stability dependent on the deterioration and/or temperature and/or microphony, the phase jitter or the single sideband phase noise power density (dBm/Hz or, with regard to the signal power, dBc/Hz) in different frequency intervals.

Due to their excellent properties (short-term stability, low carrier-proximal phase noise, low noise floor, low price), primarily quartz oscillators are used as signal sources for reference signals. To support a low sensitivity relative to temperature fluctuations, these are frequently operated in a regulated oven (oven controlled crystal oscillator, OCXO). The circuit and mechanical design represents a significant challenge for the developer and is additionally possible only in close cooperation with the quartz manufacturer. It can therefore be economically reasonable to obtain the complete OCXO as a standard component. In the circuit design, the measures necessary to achieve the individual requirements compete to a certain extent. For example, in quartz oscillators a minimum deterioration results due to the use of quartz grinding, but this that does not simultaneously represent an optimum with regard to a low phase noise. Under the circumstances, compromises must be made in the specification of the various parameters or a suitable OCXO that satisfies all specified values cannot be found at least (in the predetermined price range).

A further difficulty arises from the fact that quartz for this application can be produced only for frequencies up to a few hundred MHz (harmonic quartz). Its quality additionally severely decreases with increasing frequency.

The generation of extremely long-term stable and low-noise reference signals, as well as high-quality reference signals with frequencies greater than 100 MHz, is thus not possible with a conventional OCXO by itself. Rather, particular circuit-oriented measures are required.

Circuit arrangements of the aforementioned type are known from the text by Ulrich L. Rohde, "Microwave and Wireless Synthesizers—Theory and Design", pages 106 through 110, published 1997. Three technically feasible solution possibilities are contrasted there for a reference frequency preparation for frequencies greater than 200 MHz, in the example a preparation for 640 MHz.

It is common to these approaches that an OCXO signal of 10 MHz is multiplied with a factor of n=64. A fundamental basis for the above considerations is the fact that the sideband noise and possible interfering signals (spurious signals) increase by the same factor n. A rise in dB by 20*log n results from this for the single sideband noise power density, a rise of 36 dB given a multiplication by 64. Given a multiplier chain, noise contributions of the individual elements have a greater effect the further forward in the chain that they are arranged. If very low-noise doublers are used, the noise of the OCXO dominates.

The single sideband noise power density (SSB noise power density) of an oscillator signal can be determined for predetermined frequency intervals by the Leeson equation (see, for example, the text by Peter Vizmuller, "RF Design Guide—Systems, Circuits, and Equations", published 1995, page 230). As explained therein, the same connection exists between the oscillator frequency and the SSB noise power density as in the case of a frequency multiplication. A doubling of the oscillator frequency yields a rise of the SSB noise power density by 6 dB when all remaining parameters (transistor noise factor, oscillation circuit performance, signal power) are equal. As noted above, however, the quality of the quartz decreases with increasing frequency, and so in general more advantageous values with regard to the phase noise power are achieved via a multiplication of a relatively low initial frequency than by a direct generation at the end frequency.

In the aforementioned Rhode text, the possibility called architecture B is favored, but this exhibits a decisive disadvantage for some applications. Due to the extreme temperature responses for quartz filters, a rigid coupling of the phase of the 640 MHz signal to the 10 MHz signal is lost. Since the phase response of the appertaining filter scales with the multiplication factor of the following stages, a phase response of a 10 MHz filter immediately following the OCXO would have a particularly strong effect. One solution, in which the filter would be integrated into the oven, would produce a customer-specific and thus extremely expensive component as a result. If the filter is arranged further back in the chain for this reason, the filter effect decreases severely, meaning that the carrier-proximal noise is suppressed only insufficiently since, at high frequencies, technological limits exist as to the filter selection and the narrowband capabilities thereof. With increasing filter frequency, a compromise with regard to filter bandwidth and reliability of the arrangement must increasingly be made, since the filter transmission range can differ due to temperature response, deterioration or error compensation of the signal frequency.

Additionally, narrowband quartz filters present the risk of converting oscillations (for example air vibrations) into components of the electrical signal produces thereby. This behavior is designated as microphony.

A method for synchronization of a disrupted input signal with the associated transmission signal as well as a corresponding circuit arrangement is known from DE 302 92 49 C2. The method described therein is used for signals with a time-bandwidth product that is significantly larger than one (spread spectrum systems). The transmission signal is thereby regenerated from the disrupted acquisition signal by means of a phase-regulated filter. A correlation of the acquisition signal with the associated transmission signal after the occurrence of a start synchronization is by possible without conversion.

SUMMARY OF THE INVENTION

An object of the present invention is to provide a circuit arrangement that generates a long-term stable and simultaneously low-noise reference signal of high frequency, in particular over 100 MHz.

The above object is achieved in accordance with the invention in a circuit arrangement of the type initially described wherein a regulated filter with an output for the emission of the reference signal is connected downstream from the oscillation generator. A cost-effective circuit arrangement thereby results since a standard OCXO can be used. The filter effect and therewith the quality of the reference signal remain constantly at good levels since the center frequency of the filter follows (tracks) a drifting signal frequency. A phase response due to component tolerances, temperature changes and deterioration is corrected. The filter therefore can be designed as extremely narrowband. A very good filter effect for very small frequency intervals is hereby achieved with relatively small effort. A compensation of the filter can be omitted by a corresponding dimensioning. In particular application cases, the regulation can be adapted such that microphony effects are compensated. The high-frequency reference signal is then generated with a one-stage or multi-stage frequency multiplier.

In an embodiment, a frequency multiplier is connected with the output for emission of the reference signal, and a real value input of the phase controller is connected with an output of the frequency multiplier via a frequency divider, the divider value of which corresponds to the multiplier value of the frequency multiplier. No compensation of the circuit is required. Phase changes of the multiplier, including interface filters that may be necessary, are thus compensated. Large changes of the transmission phase of the interface filters in the multipliers due to deterioration are also compensated by this arrangement.

In a further embodiment, the frequency divider is designed to be switchable with a further divider value for synchronization of the phase control. This embodiment enables the use of inexpensive dividers without reset capability. In spite of this, the input divider can be triggered at a defined edge of the input signal, especially at high end frequencies (large n).

DESCRIPTION OF THE PREFERRED EMBODIMENTS

Figure 1:
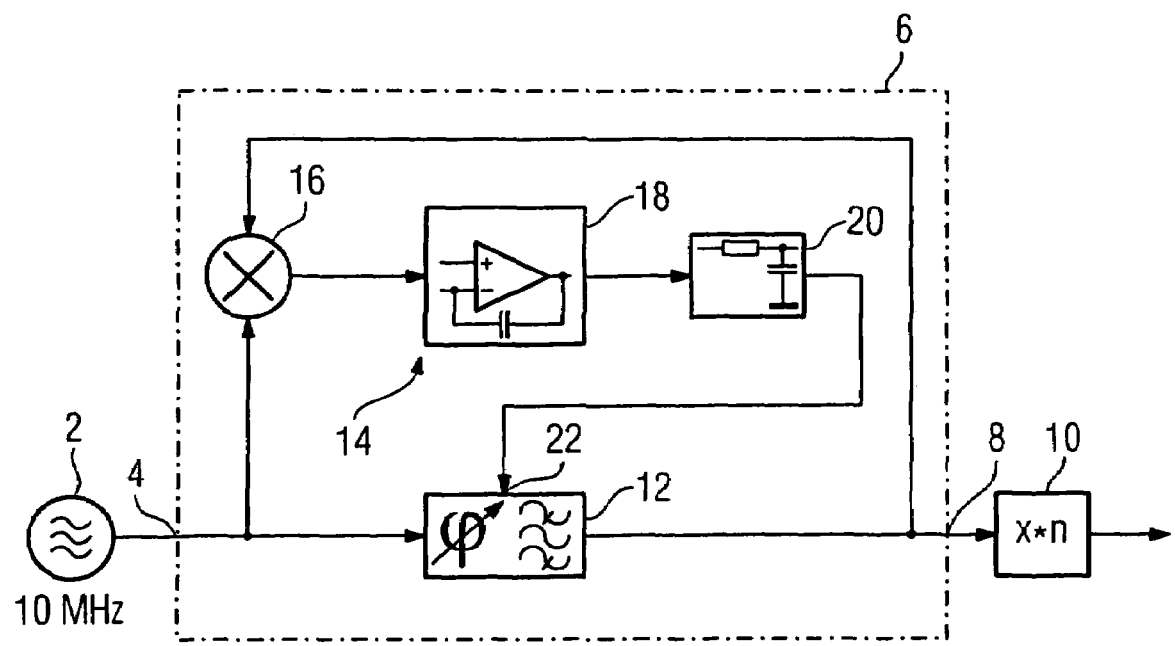
FIG. 1 is a block diagram showing the basic elements of a first circuit arrangement for generation of a reference signal in accordance with the invention.

The circuit arrangement shown in FIG. 1 for generation of a long-term stable and low-noise reference signal has a quartz oscillator 2 that is operated in a temperature-regulated oven (oven controlled oscillator, OCXO). Temperature dependencies in the frequency and the phase of the oscillator signal are therewith largely avoided. The signal output of the quartz oscillator is connected with an input 4 of a phase-regulated filter 6. The filter 6 is executed as a bandpass filter.

A long-term stable and low-noise reference signal is emitted at an output 8 of the phase-regulated filter 6. The high-frequency reference signal which exhibits a higher frequency than that of the quartz oscillator is generated by a frequency multiplier 10 connected downstream from the output 8.

The phase-controlled filter 6 comprises a special quartz filter 12 with variable center frequency which is always held to a constant transmission phase via a phase locked loop 14 (PLL). The center frequency of the quartz filter 12 hereby always agrees with the signal frequency of the quartz oscillator 2. In other words, the center frequency of the quartz filter 12 follows an input signal that drifts in terms of frequency. The quartz filter 12 can be executed as very narrowband since temperature responses and component tolerances are compensated by the regulation.

The phase control loop 14 includes a desired-real value comparator 16 and a regulator 18 with feedback, downstream from which a low-pass filter 20 is connected. The output of the low-pass filter 20 is connected with an adjustment input 22 of the quartz filter 12.

The desired-real value comparator 16 is realized as a phase discriminator in the form of a multiplier. The characteristic line of the multiplier follows a cosine function of the difference of the phase of the reference signal at the output 8 and the phase of the oscillator signal at the input 4. The arrangement is dimensioned such that the regulation sets a phase difference of 90°, which corresponds to a cosine value of zero. In this operating state, 0 V detector voltage appears at the output of the desired-real value comparator 16. This has the advantage that only the phase enters into the regulation. Amplitude differences are suppressed.

Figure 2:
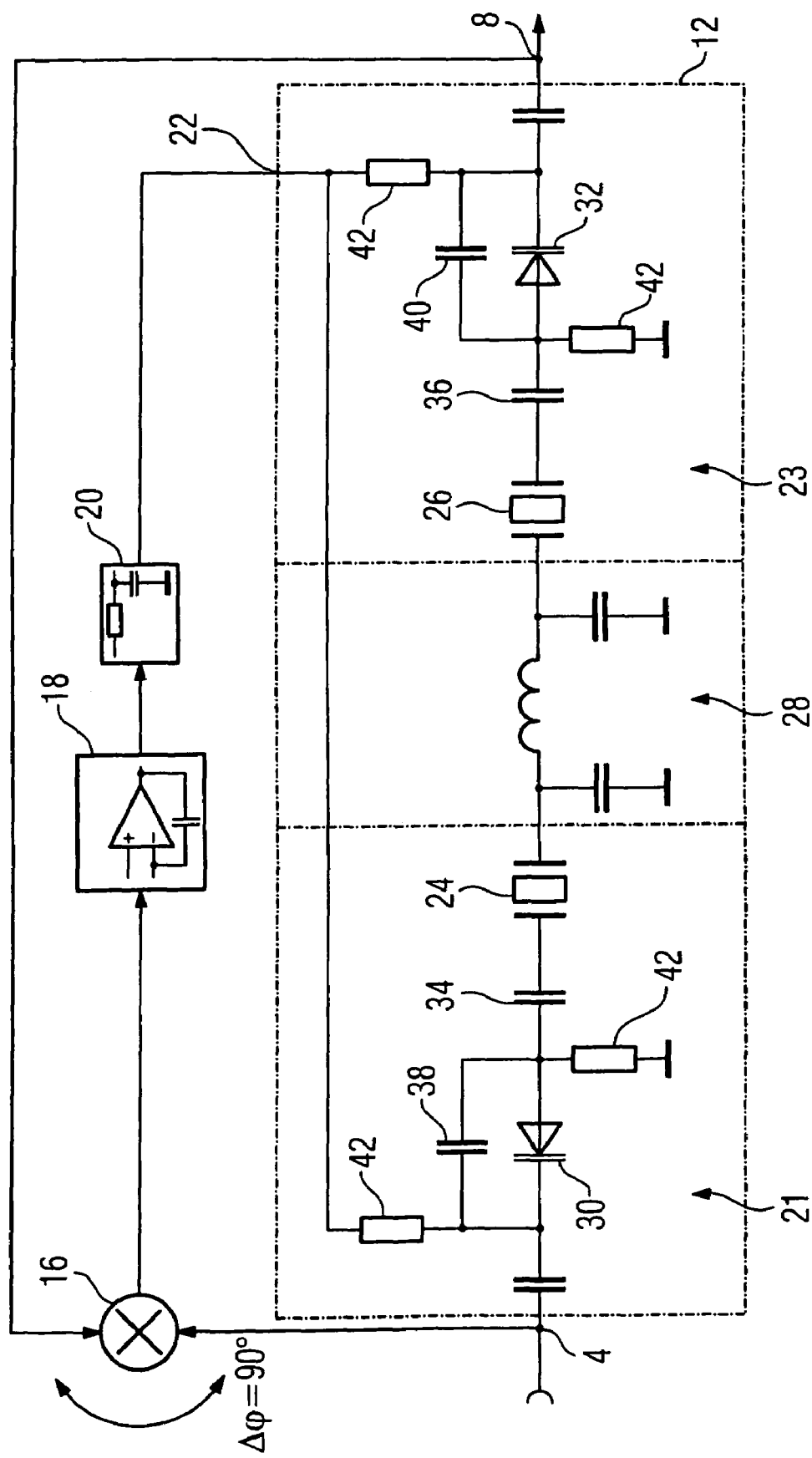
FIG. 2 is a circuit of a first embodiment for generation of a reference signal in accordance with the invention.

FIG. 2 shows the circuit design of the quartz filter 12 in detail. The quartz filter 12 is designed with two quartz crystals 24 and 26 operated in serial resonance, which quartzes 24 and 26 are connected in series via a 90° phase shifter 28. Capacitive diodes 30 and 32 are respectively connected in series with the quartz crystals 24 and 26. The resonance frequency of the quartz crystals 24, 26 can be adjusted by the variable capacitance of the capacitive diodes 30, 32. In the resonant case, the quartz crystals 24, 26 operated in serial resonance exhibit a transmission phase of 0°. The required 90° results in combination with the 90° phase shifter 28. The 90° phase shifter additionally operates as an impedance inverter and thus increases the effect of the circuited serial oscillating circuit. A cascading of further filters to increase the selectivity is possible.

By means of serial capacitors 34, 36 and parallel capacitors 38, 40, the desired operating point and operating range of the phase control loop can be adjusted in connection with the characteristic of the capacitive diodes 30, 32. The resistors 42 serve as a direct voltage feed of the control voltage of the regulator 18 to the capacitive diodes 30, 32.

Since only temperature response, deterioration and component tolerances should be compensated by the phase regulation, the regulation dynamics can be dimensioned very slowly. The noise of the phase discriminator 16 and from operation amplifiers in the controller 18 therefore can be effectively suppressed by the low-pass filter 20.

Figure 3:
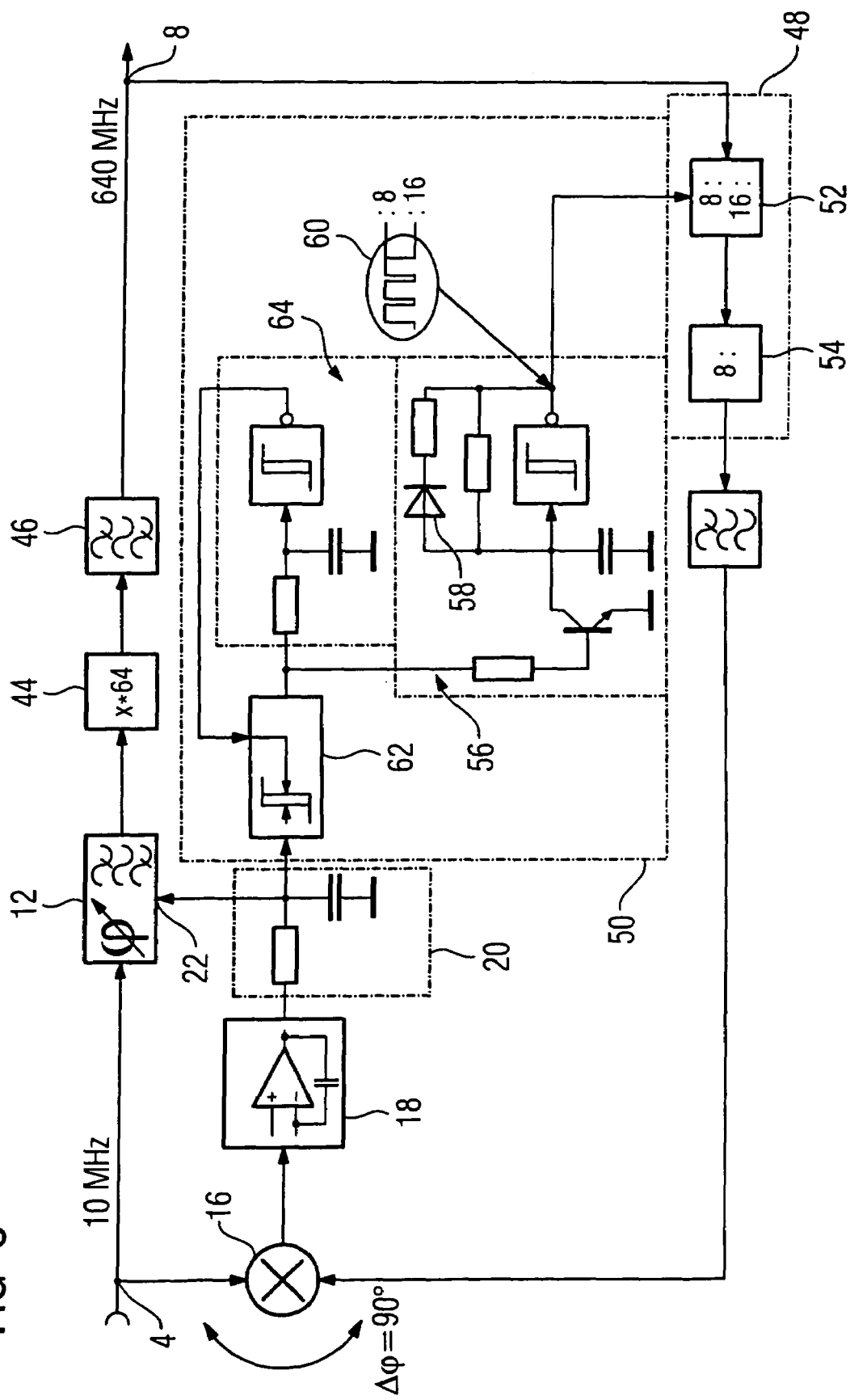
FIG. 3 is a circuit diagram of a second embodiment for generation of a reference signal of high frequency in accordance with the invention.

FIG. 3 shows the design of a modified circuit arrangement for reference signal generation with a frequency of 640 MHz from an oscillator signal of 10 MHz. The control loop in this embodiment is expanded such that it also includes a subsequent multiplier stage 44, including an interface filter 46. For phase regulation, the frequency of the output signal at the output 8 must be divided (with a frequency divider 48) by the same factor n=64 as is used for multiplication in the multiplication stage 44. Only the output signal correspondingly decreased again in terms of frequency can be compared with the input signal.

A peculiarity results due to the characteristic of the phase control loop that is present, the control range of which is limited to the adjustment range of the quartz filter 12 with a variable center frequency. This differs from a conventional phase control with a voltage-controlled oscillator (VCO) that can compensate arbitrary phase changes. Presently the transmission phase must lie in a defined range in the passage of the chain of multiplier 44 and divider 48. After an activation, the divider 48 used in the feedback path can trigger at n differing clock pulse edges of the output signal. This means that the relative phase of the signal divided by n (here n=64) can assume n different states with regard to a 10 MHz input signal, dependent on the start edge of the divider, thus the edge of the 640 MHz signal at the output 8 with which the divider 48 starts running.

After the activation, a particular synchronization circuit 50 automatically "searches" for the start edge via which a phase difference of approximately 90° results at the detector. The step width in the search hereby amounts to 360°/n. The regulation voltage at the adjustment input 22 serves as an evaluation criterion.

The frequency divider 48 is formed by two sub-dividers 52 and 54 that respectively divide the input frequency present thereat by only $\sqrt{n}$. Given a total division factor of 64 as is present, each sub-divider 52, 54 decreases the frequency by a factor of 8. For functional interaction with the synchronization circuit 50, the input-side sub-divider 52 is executed as a dual-modulus divider whose division factor can be switched from 8 to 16 and back. Given each switching of the division factor, the sub-divider 52 generally locks at a new input edge. Other divisions of the division factors or the use of a single 65/64 dual-modulus divider are similarly possible. The same effect is also to be achieved by switching away the input signal. This likewise forces a new initiation of the input counter. The realization of a fast divider input switch is, however, significantly more technically elaborate than the usage of a dual-modulus divider.

The synchronization circuit 50 has a multi-vibrator 56 with which the dual-modulus divider 52 is periodically, temporarily switched. A diode 58 causes the switching times for the divider factor 16 to be distinctly shorter than the monitoring times for the divider factor 8. This is additionally illustrated in FIG. 3 by a timing diagram 60 of the output signal, which time diagram (60) is associated with the output of the multi-vibrator. The search time of the edge for the correct phase is thereby shortened.

A window comparator 62 generates the control signal for the multi-vibrator 60. If the output voltage of the regulator emitted via the low-pass filter 20 falls into a predefined narrow window of the window comparator 62 within the monitoring time, its output signal goes to high. The multi-vibrator 56 is thereby halted. Insofar as this output voltage does not move from the window during a predetermined time span, the window of the window comparator 62 is switched from "narrow" to "wide" via the output signal of a timing element 64. The position and the width of the window must be adapted to the components used.

The arrival of the frequency of the quartz oscillator 2 after the activation causes the voltage at the adjustment input 22 to initially exit the narrow window again. The output voltage of the window comparator 62 then falls back to "low"; the process begins anew. Only when the signal of the quartz oscillator 22 has reached its stable desired frequency does a final state appear. Via the switchable window width it is ensured that sufficient regulation reserve is present after the ultimate locking and the subsequent expansion of the window width.

Compared to an arrangement that is also possible with fixed, edge-triggered dividers with reset function, with the circuit according to FIG. 3 achieves the advantage that the actual control range (and thus the control slope) of the filter can be kept very small since no response to component parameter scatterings must be accounted for. A large control slope would favor (promote) an amplitude-phase modulation conversion on the characteristic lines of the capacitive diodes 30, 32, meaning that the amplitude modulation noise of the phase detector and of the operation amplifier on the control voltage would be converted into phase modulation noises in the signal. Such compensation is not needed.

Although modifications and changes may be suggested by those skilled in the art, it is the intention of the inventors to embody within the patent warranted hereon all changes and modifications as reasonably and properly come within the scope of their contribution to the art.

We claim as our invention:

1. A circuit for generating a reference signal, comprising:
    an oscillation generator that generates an oscillator signal at an output thereof, having an oscillator signal frequency;
    a phase-regulated quartz filter having a signal input connected to the output of the oscillator generator to receive the oscillator signal therefrom, a control input, and an output, said quartz filter being configured to form a low-noise reference signal having long term stability from said oscillator signal, said quartz filter emitting said low-noise reference signal at the output thereof;
    a frequency multiplier having an input connected to the output of the quartz filter to receive the low-noise reference signal therefrom, said frequency multiplier being configured to form a high-frequency reference signal from said low-noise reference signal; and
    a phase control circuit connected across said signal input and said output of said phase-regulated quartz filter to receive said output of said quartz filter and said output of said oscillator generator as inputs thereto, said control circuit being configured to generate a control signal supplied to said control input of said phase-regulated quartz filter to adjust a center frequency of said phase-regulated quartz filter to cause said quartz filter to exhibit a constant transmission phase and to cause said center frequency of said quartz filter to coincide with said oscillator signal frequency.

2. A circuit as claimed in claim 1 wherein said control circuit is configured to set a constant transmission phase of 90° in said phase-regulated quartz filter.

3. A circuit as claimed in claim 1 wherein said phase-regulated quartz filter comprises:
    a first quartz crystal having an input and an output, and a second quartz crystal having an input and an output, said first and second quartz crystals being operated in series resonance;
    a 90° phase shifter connected between said output of said first quartz crystal and said input of said second quartz crystal;
    a first capacitor diode connected between the input of said first quartz crystal and said signal input and said control input of said quartz filter, said first capacitor diode being configured to adjust the resonance frequency of the first quartz crystal; and
    a second capacitor diode connected to said output of said second quartz filter and to said output of said quartz filter, said second capacitor diode being configured to adjust the resonance frequency of said second quartz crystal.

4. A circuit as claimed in claim 3 wherein said first and second quartz crystals are operated in said series resonance with a transmission phase of 0° when resonant.

5. A circuit as claimed in claim 3 wherein said quartz filter comprises:
- a first parallel capacitor connected in parallel with said first capacitor diode;
- a first series capacitor connected in series between the input of said first quartz crystal and said first capacitor diode;
- a second parallel capacitor connected in parallel with said second capacitor diode;
- a second series capacitor connected in series between the output of said second quartz crystal and said second capacitor diode; and
- said first parallel capacitor, said first series capacitor, said second parallel capacitor and said second series capacitor being dimensioned to set an operating point and an operating range of said phase control circuit.

6. A circuit as claimed in claim 1 wherein said phase control circuit comprises a phase detector and a phase regulator, said phase detector having a first phase detector input connected with the output of the oscillation generator and having a second phase detector input connected with the output of the quartz filter, and having a phase detector output connected to an input of the phase regulator, and said phase regulator having a phase regulator output connected to the control input of the quartz filter.

7. A circuit as claimed in claim 6 wherein said phase control circuit comprises a low-pass filter connected between said phase regulator output and said control input of said quartz filter.

8. A circuit as claimed in claim 6 wherein said phase regulator is an integral regulator.

9. A circuit as claimed in claim 1 wherein said phase control circuit comprises a phase detector and a phase regulator, said phase detector having a first phase detector input connected to the output of the oscillation generator, a second phase detector input connected to the output of said frequency multiplier, and a phase detector output connected to an input of the phase regulator, and said phase regulator having a phase regulator output connected to the control input of the quartz filter.

10. A circuit as claimed in claim 9 wherein said phase control circuit comprises a low-pass filter connected between the phase regulator output and the control input of the quartz filter.

11. A circuit as claimed in claim 9 comprising an interface filter connected downstream from said frequency multiplier.

12. A circuit as claimed in claim 11 comprising a frequency splitter connected between the second phase detector input and an output of said interface filter.

13. A circuit as claimed in claim 12 comprising a low-pass filter connected between said phase regulator output and said control input of said quartz filter, and a synchronization circuit connected between said low-pass filter and said frequency splitter, said synchronization circuit being configured to automatically search for a start edge after activation thereof, that produces a phase difference of 90° at the phase detector.

* * * * *